(12) United States Patent
Takami

(10) Patent No.: US 7,369,215 B2
(45) Date of Patent: May 6, 2008

(54) LASER CRYSTALLIZATION APPARATUS

(75) Inventor: Yoshio Takami, Yokohama (JP)

(73) Assignee: Advanced LCD Technologies Development Center Co., Ltd., Yokohama-shi (JP)

( * ) Notice: Subject to any disclaimer, the term of this patent is extended or adjusted under 35 U.S.C. 154(b) by 223 days.

(21) Appl. No.: 11/193,432

(22) Filed: Aug. 1, 2005

(65) Prior Publication Data
US 2006/0028633 A1  Feb. 9, 2006

(30) Foreign Application Priority Data
Aug. 3, 2004  (JP)  ............................. 2004-226667

(51) Int. Cl.
*G03B 27/54* (2006.01)

(52) U.S. Cl. ..................... 355/67; 355/30; 355/53; 359/819; 359/820; 430/5

(58) Field of Classification Search ............... None
See application file for complete search history.

(56) References Cited

U.S. PATENT DOCUMENTS

| | | | |
|---|---|---|---|
| 5,642,214 A * | 6/1997 | Ishii et al. ................ 349/96 |
| 6,545,746 B1 * | 4/2003 | Nishi ......................... 355/53 |
| 6,649,544 B2 * | 11/2003 | Yamazaki ................. 438/795 |
| 6,750,424 B2 * | 6/2004 | Tanaka ................ 219/121.75 |
| 6,759,313 B2 * | 7/2004 | Yamazaki et al. ......... 438/487 |
| 6,765,647 B1 * | 7/2004 | Nishi ......................... 355/55 |
| 7,056,626 B2 * | 6/2006 | Taniguchi et al. ............ 430/5 |
| 2001/0028456 A1 * | 10/2001 | Nishi ......................... 356/400 |
| 2002/0145733 A1 * | 10/2002 | Wada et al. ............. 356/237.2 |
| 2003/0017658 A1 * | 1/2003 | Nishitani et al. ........... 438/149 |
| 2004/0161676 A1 * | 8/2004 | Taniguchi et al ............. 430/5 |
| 2004/0165161 A1 * | 8/2004 | Hara ............................ 355/30 |
| 2004/0218160 A1 * | 11/2004 | Hara ............................ 355/53 |
| 2004/0266080 A1 * | 12/2004 | Jyumonji et al. ........... 438/166 |

OTHER PUBLICATIONS

Masakiyo Matsumura, "Preparation of Ultra-Large Grain Silicon Thin-Films by Excimer-Laser", Journal of the Surface Science Society of Japan, vol. 21, No. 5, 2000, pp. 278-287.

* cited by examiner

*Primary Examiner*—W. B. Perkey
*Assistant Examiner*—Warren K Fenwick
(74) *Attorney, Agent, or Firm*—Oblon, Spivak, McClelland, Maier & Neustadt, P.C.

(57) ABSTRACT

A laser crystallization apparatus has a light source, a phase shifter which modulates a laser light from the light source, an illumination system which is provided between the light source and the phase shifter, homogenizes a light intensity of the laser light from the light source and illuminates the phase shifter with the homogenized light, a stage which supports a non-single-crystal semiconductor, an image formation optical system having a plurality of optical members which is provided between the semiconductor on the stage and the phase shifter and forms an image of the modulated laser beam at a desired part on the semiconductor, and a temperature adjustment portion which adjusts a temperature of the optical member by heating or cooling the optical members of the image formation optical system.

18 Claims, 8 Drawing Sheets

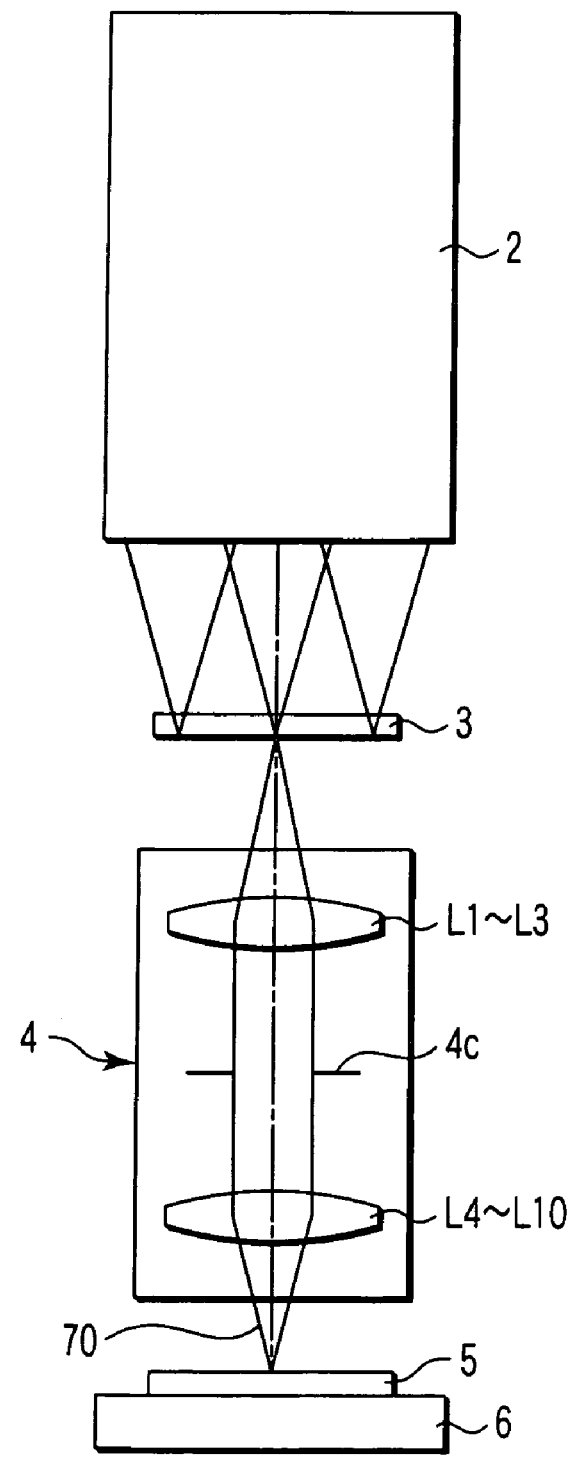
F I G. 1

LASER CRYSTALLIZATION APPARATUS

CROSS-REFERENCE TO RELATED APPLICATIONS

This application is based upon and claims the benefit of priority from prior Japanese Patent Application No. 2004-226667, filed Aug. 3, 2004, the entire contents of which are incorporated herein by reference.

BACKGROUND OF THE INVENTION

1. Field of the Invention

The present invention relates to a laser crystallization apparatus which generates a crystallized semiconductor film by irradiating a polycrystal semiconductor film or an amorphous semiconductor film with a laser light having a predetermined light intensity distribution.

2. Description of the Related Art

A thin film transistor (TFT) used for a switching element or the like which selects a display pixel in a liquid crystal display (LCD) is formed by using amorphous silicon or polysilicon.

Polysilicon has a higher mobility of electrons or electron holes than that of amorphous silicon. Therefore, when a transistor is formed by using polysilicon, a switching speed and hence a display response speed become higher than those in the case of forming the same by using amorphous silicon. Further, a peripheral LSI can comprise a thin film transistor formed on glass. Furthermore, there is an advantage of reducing a design margin of any other component. Moreover, when peripheral circuits such as a driver circuit or a DAC are incorporated in a display, these peripheral circuits can be operated at a higher speed.

Since polysilicon comprises an aggregation of crystal grains, when, e.g., a TFT transistor is formed, a crystal grain boundary is formed in a channel region, this crystal grain boundary serves as a barrier, and a mobility of electrons or electron holes is reduced as compared with that of single-crystal silicon. Additionally, each of many thin film transistors formed by using polysilicon has a different number of crystal grain boundaries formed in a channel region, and this difference becomes an irregularity, resulting in a problem of ununiformity in display in the case of LCD. Thus, there has been recently proposed a larger induced crystallization method which generates crystallized silicon having a larger grain size than with the channel region variety in number of crystal grain boundaries in the channel region.

As this type of crystallization method, there is known a "phase control ELA (Excimer Laser Annealing) method" which generates a crystallized semiconductor film by irradiating a phase shifter approximated in parallel with a polycrystal semiconductor film or a non-single-crystal semiconductor film with an excimer laser light. The details of the phase control ELA method is disclosed in, e.g., Journal of The Surface Science Society of Japan, Vol. 21, No. 5, pp. 278-287, 2000.

In the phase control ELA method, a light intensity distribution having an inverse peak pattern (a pattern in which a light intensity is minimum at the center and the light intensity is suddenly increased toward the periphery) in which a light intensity at a point corresponding to a phase shift portion of a phase shifter is lower than that in the periphery is generated, and a non-single-crystal semiconductor film (a polycrystal semiconductor film or an amorphous semiconductor film) is irradiated with a light having this light intensity distribution with an inverse peak shape. As a result, a temperature gradient is generated in a fusion area in accordance with a light intensity distribution in an irradiation target area, a crystal nucleus is formed at a part which is solidified first or a part which is not fused in accordance with a point where the light intensity is minimum, and a crystal grows from the crystal nucleus in a lateral direction toward the periphery, thereby generating a single-crystal grain with a large particle size.

Further, in Jpn. Pat. Appln. KOKAI Publication No. 2000-306859, an image formation optical system is arranged between a phase shifter having a line-and-space pattern with a phase difference of 180 degrees and a processed substrate. Furthermore, the processed substrate is irradiated through the image formation optical system with a light having a light intensity distribution with an inverse peak pattern generated through the phase shifter, thereby generating a crystallized semiconductor film on the processed substrate.

BRIEF SUMMARY OF THE INVENTION

In order to manufacture a crystal grain in the same size and the same position with excellent reproducibility, a magnification (a reducing magnification or an equal magnification) and an image plane position (a focal position) of an image formation optical system subjected to aberration correction must not fluctuate, or the magnification and the image plane position must be able to be corrected. For example, in the case of a mask pattern of 10 mm×10 mm which is used for manufacturing a crystal grain of 4 μm, when a magnification of the image formation optical system is changed from 1/5.000 to 1/4.995 (a change of 0.1%), an irradiation area size varies from 2 mm×2 mm to 2.002 mm×2.002 mm on a processed substrate. In this case, for example, when a left end of an irradiation area of 2 mm×2 mm is determined as a reference, a position of a crystal grain is shifted to the right-hand side by 2 μm (0.002 mm) at a right end. As a result, in a TFT manufacturing process which is performed in a process after laser crystallization, a positioning error is occurred.

Moreover, when an image plane position of the image formation optical system shifts more than, a depth of focus (DOF), a desired light intensity distribution cannot be obtained on the processed substrate, and a crystal grain of a desired size cannot be thereby formed.

It is an object of the present invention to provide a laser crystallization apparatus which can decrease a variation of a magnification and a deviation of an image plane position of an image formation optical system, and can correct an image plane position according to the deviation thereof, and form a crystal grain with a desired size at a desired position with the excellent reproducibility.

According to a first aspect of the present invention, there is provided a laser crystallization apparatus for applying a laser beam to a non-single-crystal semiconductor to locally fuse the non-single-crystal semiconductor and perform growth on crystal grains that are crystallized while being solidified, the apparatus comprising a light source (2a); a spatial intensity modulation optical element (3) which modulates an intensity and a phase of the laser light from the light source; an illumination system (2) which is provided between the light source and the spatial intensity modulation optical element, homogenizes a light intensity of the laser light from the light source and illuminates the spatial intensity modulation optical element with the homogenized light; a stage (6) which supports the substrate on which the non-single crystal semiconductor film is deposited (5); an image formation optical system (4) having a plurality of optical members (L1 to L10, 4c) which is provided between the non-single-crystal semiconductor on the stage and the spatial intensity modulation optical element and forms an image of a laser light modulated by the spatial intensity modulation optical element at a desired part on the non-single-crystal semiconductor; and a temperature adjustment portion (10 to 17, 20 to 22, 42 to 48) which adjusts a temperature of the optical members by heating or cooling the optical members of the image formation optical system.

According to a second embodiment of the present invention, there is provided a laser crystallization apparatus for applying a laser beam to a non-single-crystal semiconductor to locally fuse the non-single-crystal semiconductor and perform growth on crystal grains that are crystallized while being solidified, the apparatus comprising a light source (2*a*); a spatial intensity modulation optical element (3) which modulates an intensity and a phase of the laser light from the light source; an illumination system (2) which is provided between the light source and the spatial intensity modulation optical element, homogenizes a light intensity of the laser light from the light source and illuminates the spatial intensity modulation optical element with the homogenized light; a stage (6) which supports the substrate on which the non-single crystal semiconductor film is deposited; an image formation optical system (4) having a plurality of optical members and a holding member which holds the optical members, which image formation optical system is provided between the non-single-crystal semiconductor on the stage and the spatial intensity modulation optical element and forms an image of a laser light modulated by the spatial intensity modulation optical element at a desired part on the non-single-crystal semiconductor; a temperature adjustment portion (10 to 17, 20 to 22, and 42 to 48) which adjusts a temperature of the optical members by heating or cooling the optical members of the image formation optical system or by heating or cooling the holding member; a temperature sensor (22) which detects a temperature of at least one of the optical members and the holding member; and position adjusting means (6, 10) for relatively moving the stage and the image formation optical system along an optical axis of the image formation optical system based on a detected temperature from the temperature sensor and thereby adjusting a relative position of the image formation optical system and the non-single-crystal semiconductor.

According to the present invention, a variation of a magnification and a deviation of an image plane position of the image formation optical system can be decreased, and the image plane position can be corrected according to the deviation thereof, and crystal grains with a desired size can be formed at a desired part on the non-single-crystal semiconductor with the excellent reproducibility.

Important terms in this specification are defined as follows.

"Crystallization" means that a crystal grows with a crystal nucleus as a starting point in a process that a crystallization target film is fused and the melt is solidified. "Lateral growth" means that the growth of a crystal grain advances in the lateral direction along a film surface in a process in which a crystallization target film is fused and the melt is solidified. A "light intensity distribution" or a "beam profile" means a two-dimensional intensity distribution of a light which enters a crystallization target film. A "laser fluence" is a unit of measurement indicating an energy density of a laser light at a given position, and means a value obtained an energy quantity per unit area, which is specifically an average intensity of a laser light measured in a light source or an irradiation area. An "attenuator" means an optical element which attenuates an intensity of a laser light. A "homogenizer" means an optical element which divides an incident light into a plurality of lights, overlapes one another the divided lights having same area and homogenizes a light intensity on a specific plane. Additionally, a "homogenization plane" means a specific plane on which a light which has been transmitted through a homogenizer is converged. A "spatial intensity modulation optical element" means a photomask which modulates a light intensity and also modulates a phase of a light. In the laser crystallization apparatus, the spatial intensity modulation optical element is referred to as a "phase shifter" and differentiated from a phase shift mask used in an exposure step of a photolithography process. In the phase shifter, a step is formed to, e.g., a quartz substrate by etching.

An "image plane" means a plane on which a light which has been transmitted through the image formation optical system in the laser crystallization apparatus is converged. Specifically, a plane on which a light transmitted though a primary image formation optical system (a homogenizer, a condenser lens, a mask or the like) in a projection type laser crystallization apparatus is converted and an image is thereby formed is referred to as a "primary image plane". The primary image plane means a phase shifter plane and/or a homogenization plane when matching with the phase shifter plane and/or the homogenization plane (complete overlap). Further, in particular, a plane on which a light transmitted through a secondary image formation optical system (a reducing lens or the like) in a projection type laser crystallization apparatus is converged and an image is thereby formed is referred to as a "secondary image plane". In other words, the "secondary image plane" means a plane onto which an image formed on the primary image plane is transferred on a substrate side.

A "telecentric optical system" or a "telecentric lens optical system" means an optical system in which an aperture diaphragm is placed at a focal position of a lens and a main light ray becomes parallel with respect a lens optical axis on an object side, an image side or both the object/image sides. The "aperture diaphragm" means a light shielding frame which is provided in the optical system or in the vicinity of the optical system in order to restrict an area through which a light ray around the optical axis is transmitted.

BRIEF DESCRIPTION OF THE SEVERAL VIEWS OF THE DRAWING

FIG. 1 is a schematic view showing an outline of a laser crystallization apparatus;

DETAILED DESCRIPTION OF THE INVENTION

Figure 2:
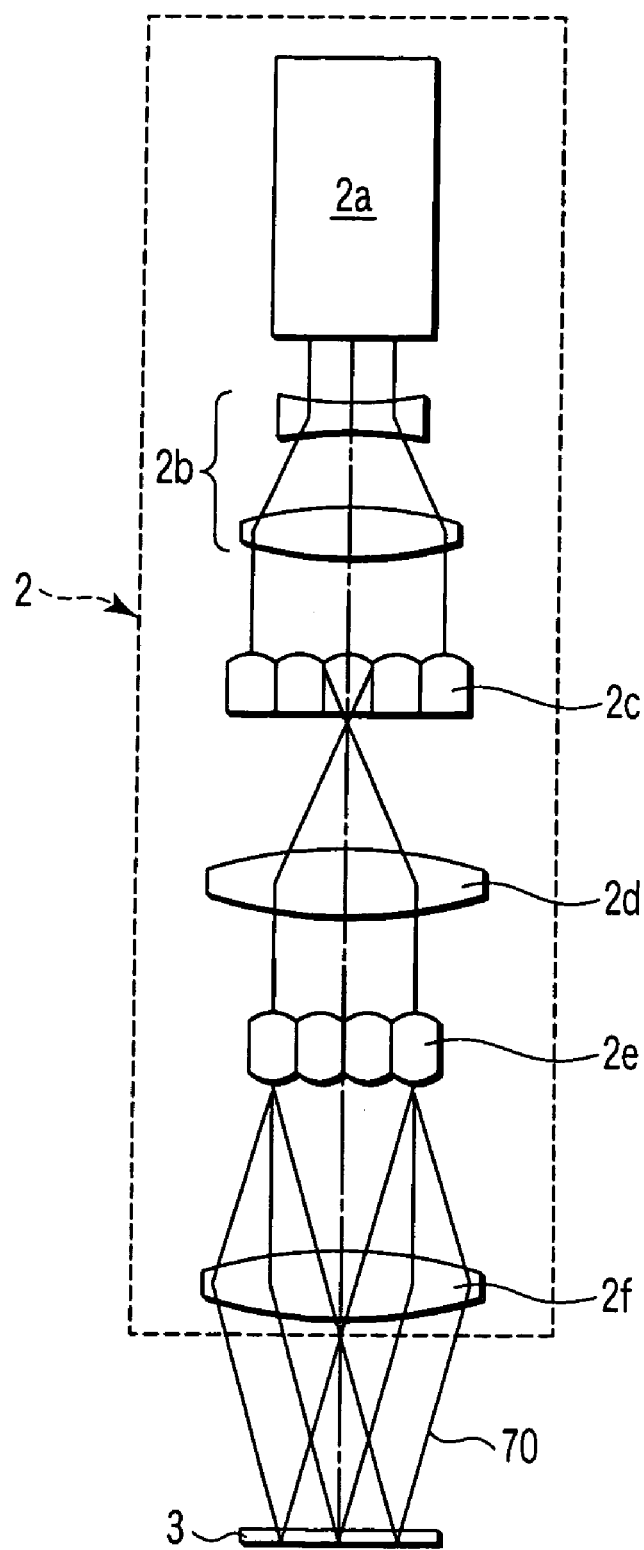
FIG. 2 is an internal perspective view showing an outline of an illumination system of the laser crystallization apparatus.

The best mode for embodying the present invention will now be described hereinafter with reference to the accompanying drawings.

As shown in FIG. 1, a laser crystallization apparatus 1 according to this embodiment has a projection type illumination system 2, a spatial intensity modulation optical element 3 (a phase shifter or a diffraction optical element) and an image formation optical system 4, and further includes a substrate stage 6 which movably supports a processed substrate 5. The substrate stage 6 includes a non-illustrated X-Y-Z-θ drive mechanism, and is moved in each direction of an X axis, a Y axis and a Z axis and subjected to θ rotation around the Z axis in order to perform positioning with respect to the optical systems 2, 3 and 4.

As shown in FIG. 2, the illumination system 2 comprises a KrF excimer laser light source 2a which emits a laser light having a wavelength of, e.g., 248 nm as a light source which outputs an energy light which fuses an amorphous silicon film on the processed substrate 5. The light source 2a includes a non-illustrated attenuator. The attenuator attenuates a laser light emitted from the light source 2a, adjusts a light intensity level of this laser light to, e.g., approximately 1 cm²/J and prevents optical members of the illumination system 2 and the image formation optical system 4 from being burned in. It is to be noted that, as the light source 2a, it is possible to use any other appropriate light source having a performance of projecting an energy light ray which fuses a crystallization processing target substance such as an XeCl excimer laser light source which emits a laser light having a wavelength of 308 nm or a YAG laser light source.

A laser light 70 exits from the light source 2a, then is transmitted through a beam expander 2b where the laser light is expanded, and enters a first fly-eye lens 2c. Then, a plurality of virtual light sources are formed on a rear focal surface of the first fly-eye lens 2c. Light beams from these virtual light sources illuminate an incidence surface of a second fly-eye lens 2e through a first condenser optical system 2d in an overlapping manner. As a result, more virtual light sources than those on the rear focal surface of the first fly-eye lens 2c are formed on a rear focal surface of the second fly-eye lens 2e.

Light beams from the plurality of virtual light sources formed on the rear focal surface of the second fly-eye lens 2e illuminate the spatial intensity modulation optical element 3 through a second condenser optical system 2f in an overlapping manner. In this example, the first fly-eye lens 2c and the first condenser optical system 2d constitute a first homogenizer. The first homogenizer homogenizes a laser light exiting from the light source 2a in relation to an incidence angle on the phase shifter 3.

Furthermore, the second fly-eye lens 2e and the second condenser optical system 2f constitute a second homogenizer. This second homogenizer homogenizes the laser light having the homogenized incidence angle from the first homogenizer in relation to a light intensity at each in-plane position on the phase shifter 3. In this manner, the illumination system 2 illuminates the phase shifter 3 with the laser light having a substantially homogeneous light intensity distribution.

The laser light 70 is subjected to phase modulation or diffraction by the phase shifter 3, and caused to enter the processed substrate 5 through the image formation optical system 4. In this example, in regard to the image formation optical system 4, the phase shifter 3 and the processed substrate 5 are arranged in an optically conjugate relationship. In other words, the processed substrate 5 is set to a surface (an image plane of the image formation optical system 4) which is optically conjugate with the phase shifter 3.

The entire image formation optical system 4 is covered with protection covers 41a and 41b. A first group of lenses L1 to L3, an aperture diaphragm 4c and a second group of lenses L4 to L10 are sequentially arranged in the protection covers 41a and 41b. Respective rim portions of these optical members L1 to L10 and 4c are supported by a lens holder 42 in a state that their optical axes are matched with each other and a state that these members are separated from each other at appropriate intervals.

An incidence window 40a is fitted in the upper protection cover 41a, an outgoing radiation window 40b is fitted in the lower protection cover 41b. The first group of lenses L1 to L3 are arranged on the incidence window 40a side (the phase shifter 3 side), and the second group of lenses L4 to L10 are arranged on the outgoing radiation window 40b side (the processed substrate 5 side). The modulated laser light 70 enters the image formation optical system 4 from the incidence window 40a, is sequentially transmitted through the first group of lenses L1 to L3, the aperture diaphragm 4c and the second group of lenses L4 to L10, and exits from the image formation optical system 4 through the outgoing radiation window 40b.

The image formation optical system 4 is an optical system which reduces a light intensity distribution of a laser light from the light source and illuminates the processed substrate 5 with this light intensity distribution. The image formation optical system 4 in this embodiment reduces and projects a laser light, but the present invention is not restricted thereto, and it may project a laser light at an equal magnification or project a laser light at an increasing magnification.

Since the lens groups L1 to L10 in the image formation optical system 4 are comprised of reduction-telecentric lenses, sizes of the second group of lenses L4 to L10 are smaller than sizes of the first group of lenses L1 to L3. Since a heat capacity of the second group of lenses L4 to L10 is smaller, they are readily overheated and overcooled as compared with the first group of lenses L1 to L3. It is to be noted that a diameter of the lower protection cover 41b is set smaller than that of the upper protection cover 41a in accordance with the lens sizes.

The aperture diaphragm 4c is arranged between the first group of lenses L1 to L3 and the second group of lenses L4 to L10. The aperture diaphragm 4c has a plurality of aperture diaphragms having aperture portions (light transmission portions) with different sizes, and the plurality of aperture diaphragms 4c are attached so that they are replaceable with respect to a laser optical path. Alternatively, as the aperture diaphragm 4c, it is possible to use an iris diaphragm which can continuously vary a size of an aperture portion. In any case, a size of the aperture portion of the aperture diaphragm 4c (i.e., an image side numeral aperture NA of the image formation optical system 4). is set so that a necessary light intensity distribution is generated on the semiconductor film of the processed substrate 5.

Figure 5A:
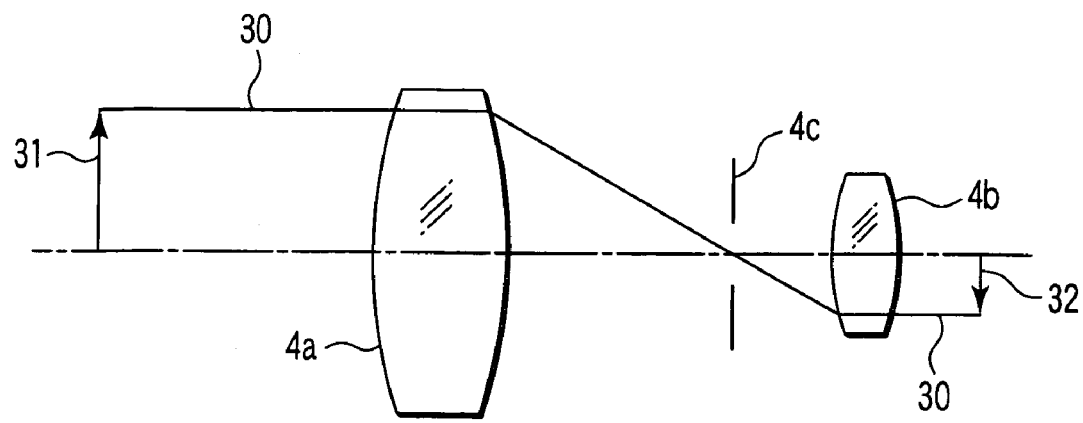
FIG. 5A is a schematic view showing a both-side telecentric lens optical system.

The both-side telecentric lens optical system is adopted for the image formation optical system 4 in this embodiment. As shown in FIG. 5A, in the both-side telecentric lens optical system, since a main light ray 30 becomes parallel to a lens optical axis on both an object side and an image side, a size of an image 32 does not vary even if a workpiece 31 on the object side is moved in the vertical direction in the drawing. Therefore, in the both-side telecentric lens optical system, a magnification is not changed in theory even if back focus varies.

Figure 5B:
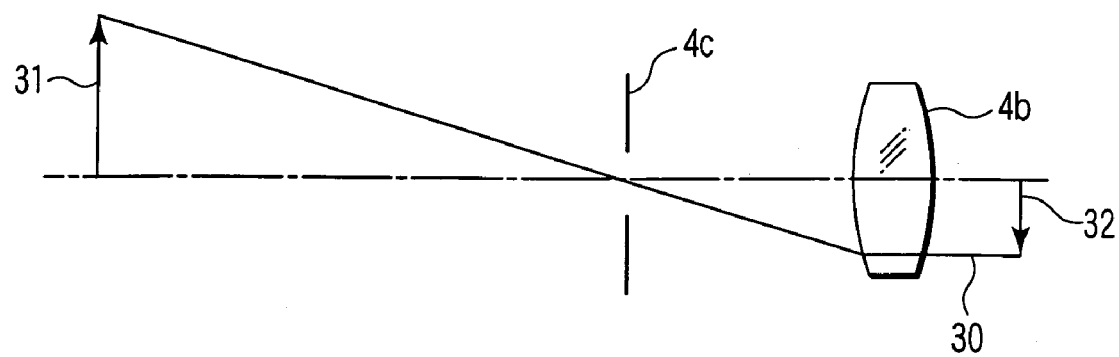
FIG. 5B a schematic view showing an image side telecentric lens optical system.

Furthermore, an image side telecentric lens optical system can be used in place of the both-side telecentric lens optical system. In the image side telecentric lens optical system, as shown in FIG. 5B, since a main light ray 30 on the image side alone becomes parallel with the lens optical axis, a size of the image 32 varies when the workpiece 31 is moved in the vertical direction in the drawing. Therefore, in the image side telecentric lens optical system, a magnification is changed when back focus varies.

The processed substrate 5 is obtained by sequentially forming an underlying film and a non-single-crystal film on, e.g., a liquid crystal display glass sheet substrate by chemical vapor deposition (CVD). The underlying insulating film is an insulating film of, e.g., $SiO_2$, and avoids mixing of a foreign particle such as Na into an amorphous silicon film when the non-single-crystal film is directly brought into contact with the glass substrate, and prevents the heat of the non-single-crystal film from being directly transmitted to the glass substrate. The non-single-crystal film is an amorphous semiconductor film or a polycrystal semiconductor film having a predetermined film thickness (e.g., approximately 50 nm).

The non-single-crystal film may be a non-single-crystal semiconductor film or a metal film. An insulating film, e.g., an $SiO_2$ film is formed as a cap film on the amorphous silicon film. The cap film is heated by a part of a light beam which enters the amorphous silicon film, and stores heat when heated. Although a temperature in a high-temperature region is relatively rapidly reduced on an irradiation target surface of the amorphous silicon film when incidence of a light beam is interrupted, the thermal storage effect alleviates this temperature drop gradient and facilitates the crystal growth with a large particle size in the lateral direction. The processed substrate 5 is positioned and held at a predetermined position on the substrate stage 6 by a vacuum chuck, an electrostatic chuck or the like. It is to be noted that the processed substrate 5 generally has a warp or a deflection of approximately ±5 μm to ±10 μm as an error of the flatness.

Thus, in the laser crystallization apparatus according to this embodiment, the non-single-crystal semiconductor film on the processed substrate 5 is irradiated with a light having a beam profile with a so-called inverse peak pattern (a V-shaped two-dimensional pattern). As a result, a temperature gradient is generated in a fusion area in an irradiation target area in accordance with the beam profile, a crystal nucleus is formed in a part which is solidified first or which is not fused in accordance with a point where a light intensity is minimum, and a crystal is subjected to lateral growth with this crystal nucleus as a starting point.

Meanwhile, in the laser crystallization apparatus, the image formation optical system 4 with a reducing magnification is often used. That is because a phase shifter or a diffraction optical element as the spatial intensity modulation optical element 3 can be readily manufactured when the image formation optical system 4 with a reducing magnification of ⅕ is used, for example (a dimension becomes fivefold as compared with a case of using the image formation optical system with an equal magnification). Moreover, that is because a light irradiation energy per unit area which enters the homogenizers (2c and 2e) in the illumination system 2 and the spatial intensity modulation optical element 3 becomes ½₅ as compared with a case of using the image formation optical system with equal magnification, and thus damage to the homogenizers (2c and 2e) and the spatial intensity modulation optical element 3 can be reduced.

Additionally, the image formation optical system 4 usually comprises 10 or more optical lenses in order to form a light intensity distribution in a range of several μm defined by the spatial intensity modulation optical element 3 on the processed substrate with a reducing magnification or an equal magnification without an aberration or a skew. Further, when an excimer laser light source is adopted as the light source 2a, an optical material used for the lenses L1 to L10 in the image formation optical system 4 is synthetic quartz or calcium fluoride (fluorite).

In this example, a thermal conductivity of calcium fluoride is 9.71 (W/(m·° C.)), and a thermal conductivity of synthetic quartz is 1.35 (W/(m·° C.)). Therefore, it can be conjectured that a lens formed of synthetic quartz has a larger change in temperature due to light irradiation than that of a lens formed of calcium fluoride. Furthermore, in case of calcium fluoride, a thermal expansion coefficient is approximately $2 \times 10^{-5}$/° C., and a temperature coefficient of a refraction factor is approximately $-1 \times 10-5$/° C. On the other hand, in the case of synthetic quartz, a thermal expansion coefficient is approximately $4 \times 10^{-6}$/° C., and a temperature coefficient of a refraction factor is approximately $1 \times 10^{-5}$/° C.

Considering temperature characteristics of such optical materials, in the image formation optical system 4, a change in image plane position (a focal position) of several μm, i.e., a change in image formation position of several μm along the optical axis of the image formation optical system 4 can be estimated with respect to a lens temperature change of 1° C. For example, in case of a crystallization apparatus using an excimer laser light, it is said that there is an image formation optical system in which an image plane position (an image formation position) is changed by approximately 10 μm with respect to a lens temperature change of 1° C.

Meanwhile, in a conventional crystallization apparatus (an apparatus before the phase control ELA method), the processed substrate is evenly irradiated with an elongated beam (e.g., 500 μm×300 mm). In this case, since a crystal grain is not positioned from the beginning, even if a change in crystal grain position of several μm is generated due to, e.g., a change in magnification of the image formation optical system, there is no problem at all.

On the other hand, in the laser crystallization apparatus according to the present invention, it is demanded to accurately apply a laser light to a desired part of the processed substrate with a positional accuracy of the micron order. Therefore, even if a quantity of a change in magnification or a change in image plane position (a primary image plane position, a secondary image plane position, and a focal position) of the image formation optical system is small, this results in a problem. For example, in cases where a laser light having a wavelength of 308 nm is used to transfer a black-and-white pattern of 2 μm through the image formation optical system having an image side numerical aperture NA=approximately 0.12, if the numerical aperture of the illumination system is equal to the incidence side numeral aperture of the image formation optical system, the depth of focus (DOF) of the image formation optical system becomes approximately ±10 μm to ±20 μm. When a diffraction optical element is used as the spatial intensity modulation optical element in order to control a light intensity distribution on the processed substrate in micron order, the depth of focus becomes smaller, and the depth of focus may be as very narrow as 5 μm or less depending on conditions.

Figure 3:
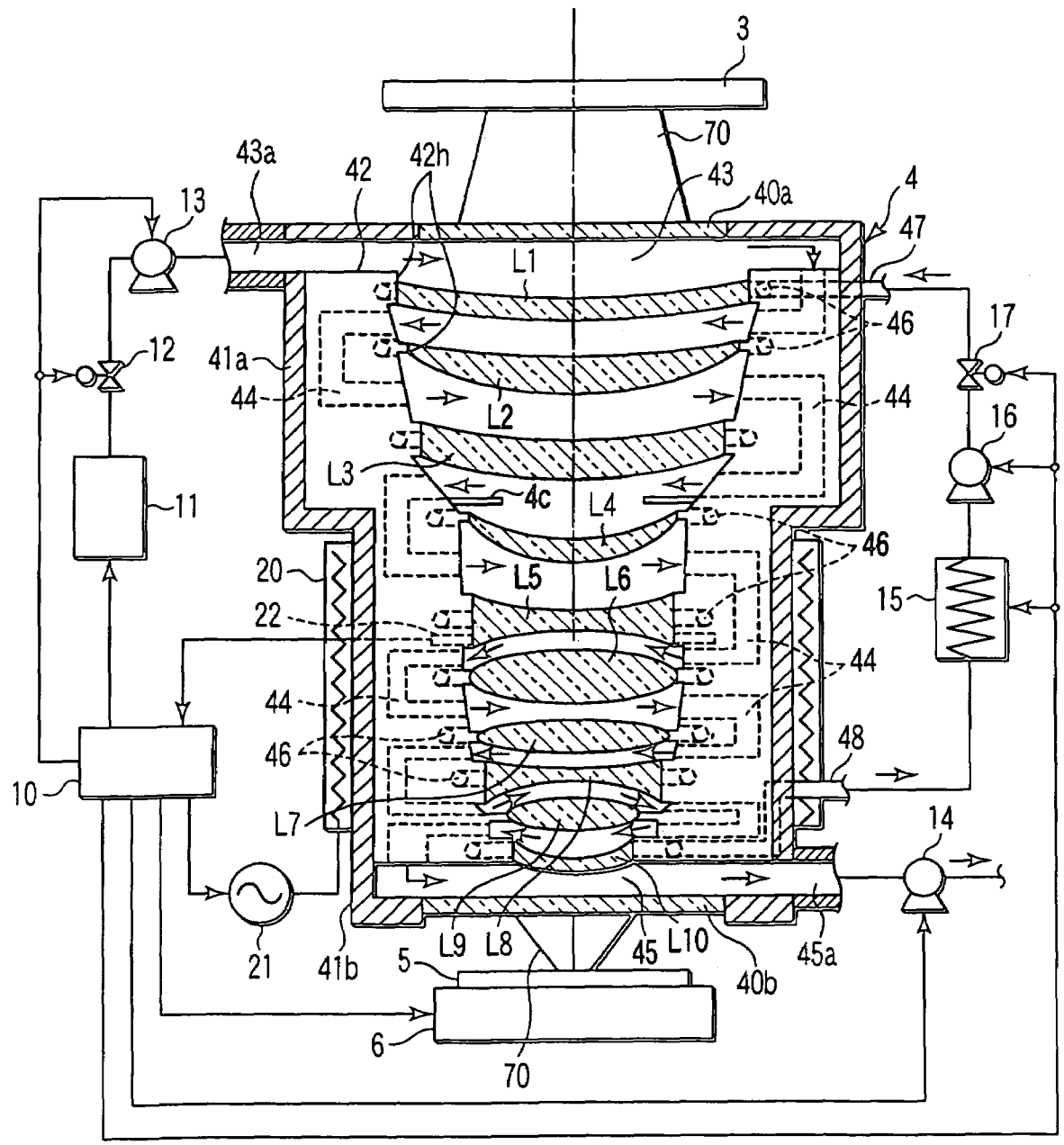
FIG. 3 is a block cross-sectional view showing a telecentric lens optical system as a primary portion of the laser crystallization apparatus according to an embodiment of the present invention.

Thus, as shown in FIG. 3, the laser crystallization apparatus 1 according to this embodiment comprises a plurality of temperature adjustment portions in order to adjust a temperature of the optical members L1 to L10 and 4c in the image formation optical system 4. When these temperature adjustment portions adjust a temperature of the optical members L1 to L10 and 4c, a magnification and an image plane position of the image formation optical system 4 can be accurately corrected. This embodiment exemplifies the following three temperature adjustment portions.

A first temperature adjustment portion is an air cooling mechanism which directly cools the optical members L1 to L10 and 4c by using a refrigerant gas. This air cooling mechanism comprises a refrigerant gas supply source 11, a valve 12, pumps 13 and 14, a gas inlet 43a, an upper space 43, an internal flow path 44 of the lens holder 42, a lower space 45 and a gas outlet 45a. The refrigerant gas supply source 11 accommodates, e.g., a low-temperature (equal to or below a room temperature) inert gas (e.g., a nitrogen ($N_2$)

gas, a helium (He) gas) or air as a refrigerant gas therein. A discharge opening of the feed pump 13 communicates with the gas inlet 43*a* of the upper protection cover 41*a*, and an intake opening of the exhaust pump 14 communicates with the gas outlet 45*a* of the lower protection cover 41*b*. It is to be noted that the refrigerant gas is discharged into air from the exhaust pump 14 in this embodiment, but an exhaust circuit may be connected with the supply source 11 in order to form a circulation circuit, thereby recycling the refrigerant gas.

Figure 4:
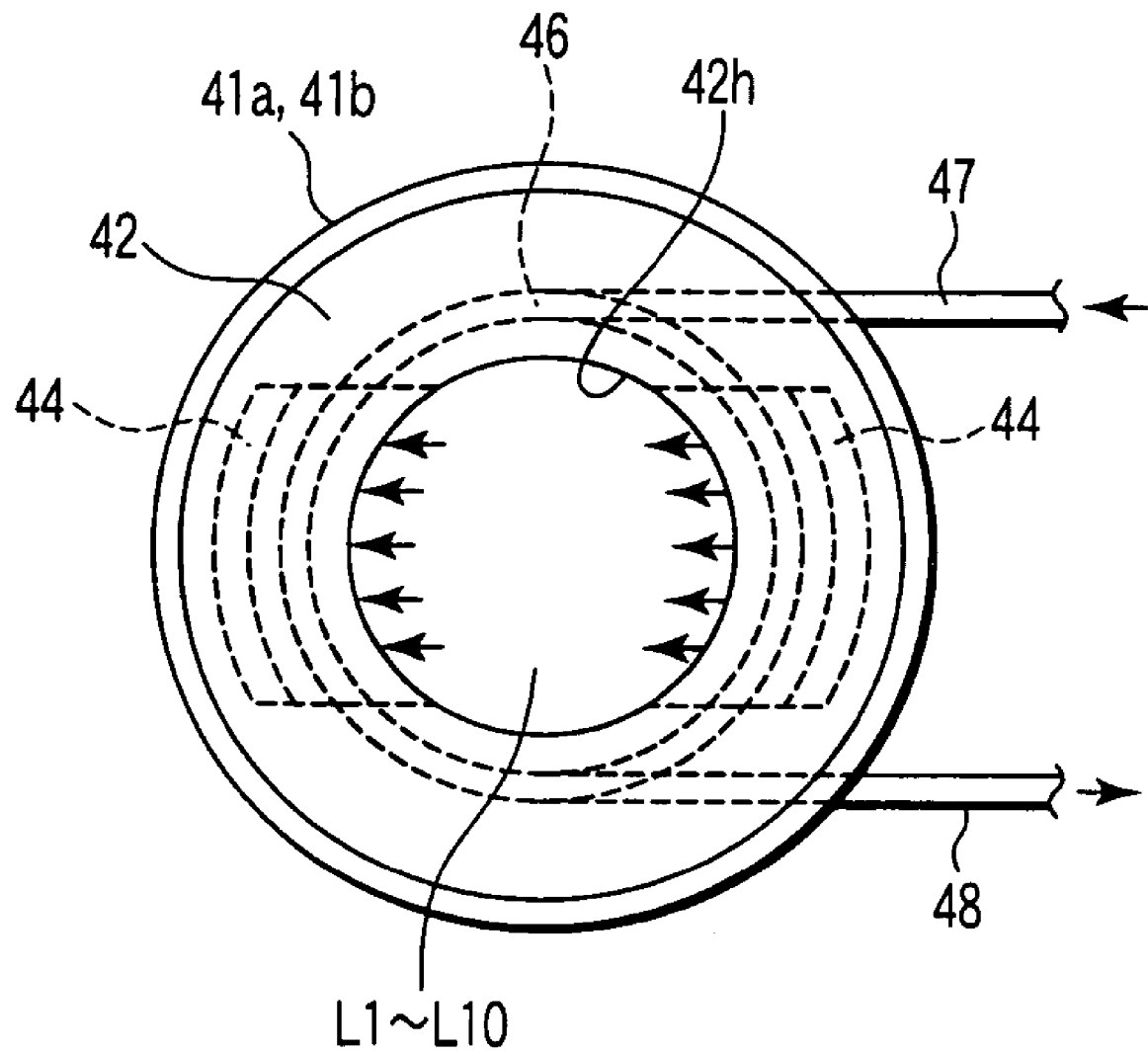
FIG. 4 is a plan view showing the telecentric lens optical system from a direction of an optical axis.

The gas inlet 43*a* communicates with the upper space 43 (directly above the lens L1), and the upper space 43 sequentially communicates with the spaces between the lenses L1 to L10 through the internal flow path 44 of the lens holder 42. Moreover, the inter-lens space on the lowermost stage communicates with the lower space 45 (directly below the lens L10) through the internal flow path 44, and the lower space 45 communicates with the gas outlet 45*a*. The internal flow path 44 is widely opened as shown in FIG. 4.

The refrigerant gas passes through the inside of the image formation optical system 4 in the order of the inlet 43*a*, the upper space 43, the internal flow path 44, the space between the lenses L1 and L2, the internal flow path 44, the space between the lenses L2 and L3, the internal flow path 44, the space between the lenses L3 and L4, the internal flow path 44, the space between the lenses L4 and L5, the internal flow path 44, the space between the lenses L5 and L6, the internal flow path 44, the space between the lenses L6 and L7, the internal flow path 44, the space between the lenses L7 and L8, the internal flow path 44, the space between the lenses L8 and L9, the internal flow path 44, the space between the lenses L9 and L10, the internal flow path 44, the lower space 45, and the outlet 45*a*, and directly cools the optical members L1 to L10 and 4*c*.

A second temperature adjustment portion is a liquid cooling mechanism which indirectly cools the optical members L1 to L10 and 4*c* by using a refrigerant liquid. This liquid cooling mechanism comprises a heat exchanger 15, a pump 16, a valve 17, a supply tube 47, an internal flow path 46 of the lens holder 42 and a return tube 48. The heat exchanger 15 performs heat exchange between a refrigerant liquid (e.g., a cooling water) and the other heat exchange fluid, and thereby cools the refrigerant liquid to a predetermined temperature which is not greater than a room temperature. An outlet side of the heat exchanger 15 communicates with the supply tube 47 through the pump 16 and the valve 17, and an inlet side of the heat exchanger 15 communicates with the return tube 48. The supply tube 47 communicates with the internal flow path 46 of the uppermost portion of the lens holder 42, and the return tube 48 communicates with the internal flow path 46 of the lowermost portion of the lens holder 42. As shown in FIG. 4, the internal flow path 46 is annularly formed to surround respective holding portions 42*h* which hold the lenses L1 to L10 on the respective stages. The lens holder 42 functions as a heat exchange jacket by in corporating these internal flow paths 46. When the refrigerant liquid is caused to flow through the internal flow path 46, not only the lenses L1 to L10 which are in contact with the holding portions 42*a* are indirectly cooled, but the entire image formation optical system 4 is efficiently cooled.

When a laser shot is repeatedly applied to a large LCD substrate, a lens temperature of the image formation optical system increases. In particular, although a temperature of the second group of lenses L4 to L10 with small sizes suddenly increases, the increase in temperature of these lenses can be suppressed since these lenses are directly or indirectly cooled by the first and second temperature adjustment portions. However, since it is difficult to completely suppress a thermal displacement of the image formation optical system, a relative position of the image formation optical system 4 and the processed substrate 5 must be adjusted in order to correct a magnification and correct an image plane position of the image formation optical system 4. That is, when a control portion 10 moves the substrate stage 6 in a direction of the Z axis based on a detected temperature from the temperature sensor 22, the processed substrate (the non-single-crystal semiconductor) 5 is positioned with respect to the image formation optical system 4 along the optical axis of the image formation optical system 4. As a result, a desired part of the non-single-crystal semiconductor on the processed substrate 5 is accurately irradiated with a laser light 70.

A third temperature adjustment portion is a heating mechanism which indirectly heats the second group of lenses L4 to L10 by using a heater 20. This heating mechanism comprises a heater 20 wound on the outer periphery of the lower protection cover 41*b*, a power supply 21 and a temperature sensor 22. As the temperature sensor 22, it is possible to use a thermocouple or the like which is attached in contact with a lens L5, for example. Since the second group of lenses L4 to L10 has smaller sizes than the first group of lenses L1 to L3, the second group of lenses L4 to L10 has a small heat capacity and are hence readily overheated or overcooled. When the group of lenses L4 to L10 are overcooled, condensation is apt to be generated on the lens surfaces, thus laser crystallization processing cannot be stably and normally performed. Thus, when a lens temperature is detected by the temperature sensor 22 and this temperature is lower than a predetermined threshold value, the second group of lenses L4 to L10 are heated by the heater 20.

As described above, in the laser crystallization apparatus 1 according to this embodiment, a temperature of the optical members L1 to L10 and 4*c* of the image formation optical system 4 is adjusted. As a result, a magnification and an image plane position of the image formation optical system 4 can be corrected, and a crystal grain with a desired size can be formed at a desired position on the processed substrate 5 with excellent reproducibility.

It is to be noted that the second temperature adjustment portion 15 to 17 cools the optical members L1 to L10 and 4*c* by using cooling water, but the temperature adjustment portion 15 to 17 may use warm water to increase a temperature of the optical members L1 to L10 and 4*c*.

Further, the control portion 10 may control each of the first temperature adjustment portion 11 to 13 and the second temperature adjustment portion 15 to 17 based on detected temperatures from the temperature sensor 22.

Furthermore, although the temperature sensor 22 is brought into contact with the lens L5 in order to directly detect a lens temperature in this embodiment, the temperature sensor may be attached in contact with the lens holder 42, thereby detecting a temperature of the lens holder 42. In this case, the control portion 10 converts a detected temperature of the lens holder into a lens temperature by using a predetermined calculating data table, thereby obtaining a lens temperature.

Moreover, a Peltier element may be attached to the lens holder or the protection cover so that the optical members can be indirectly cooled through the lens holder or the like.

A description will now be given as to an example of manufacturing a thin film transistor by using the laser crystallization apparatus according to this embodiment with reference to FIGS. 6A to 6C.

Figure 6A:
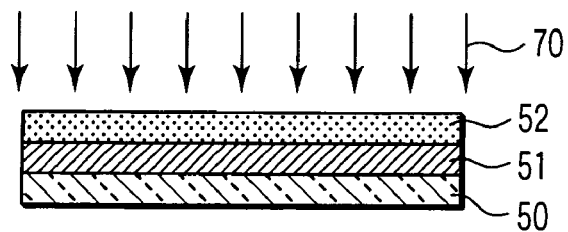
FIGS. 6A to 6E are cross-sectional schematic views respectively showing a processing target object in each process when manufacturing an electronic device by using the laser crystallization apparatus according to the present invention.

As shown in FIG. 6A, there is prepared a processed substrate 5 obtained by forming an underlying film 51 (e.g., a laminated film of SiN having a film thickness of 50 nm and $SiO_2$ having a film thickness of 100 nm) and an amorphous semiconductor film 52 (e.g., Si, Ge or SiGe having a film thickness of approximately 50 nm to 200 nm) on an insulating substrate 50 (e.g., alkali glass, quartz glass, plastic or polyimide) by a chemical vapor deposition method, a sputtering method or the like. A predetermined area on the surface of the amorphous semiconductor film 52 is irradiated with a laser light 70 (e.g., a KrF excimer laser light or an XeCl excimer laser light) by using the laser crystallization apparatus 1.

Figure 6B:
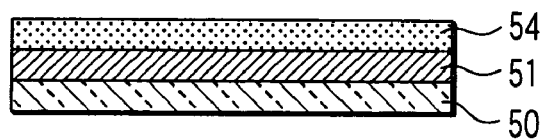
Figure 6C:
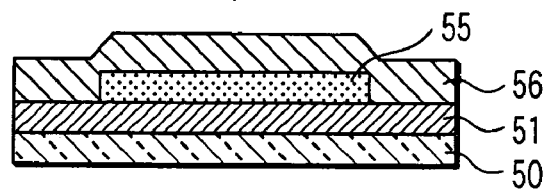
Figure 6D:
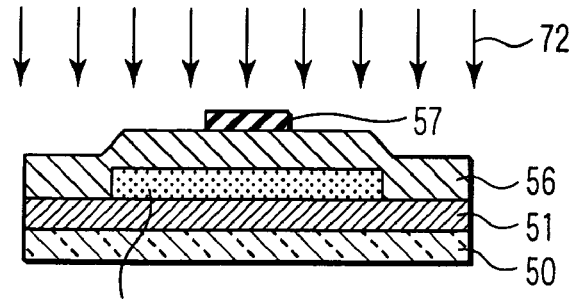
Figure 6E:
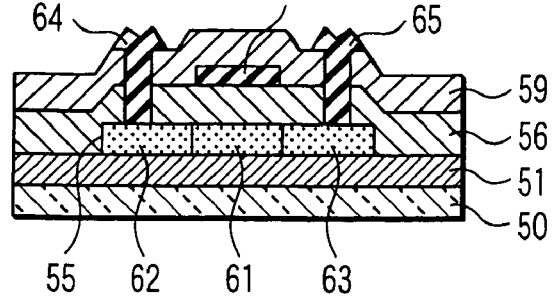

In this manner, as shown in FIG. 6B, a polycrystal semiconductor film or a single-crystallized semiconductor film 54 having a crystal with a large particle size is generated. Then, as shown in FIG. 6C, the polycrystal semiconductor film 54 or the single-crystallized semiconductor film 54 is processed into an island-shaped semiconductor film 55 which becomes an area in which, e.g., a thin film transistor is formed by using a photolithography technique, and an $SiO_2$ film having a film thickness of 20 nm to 100 nm is formed as a gate insulating film 56 on the surface by using the chemical vapor deposition method, the sputtering method or the like. Additionally, as shown in FIG. 6D, a gate electrode 57 (e.g., silicide or MoW) is formed on the gate insulating film, and an impurity ion 72 (phosphor in case of an N channel transistor, and boron in the case of a P channel transistor) is implanted with the gate electrode 57 being used as a mask. Thereafter, annealing processing (e.g., one hour at 450° C.) is performed in a nitrogen atmosphere in order to activate the impurity, and a source 62 and a drain 63 are formed to the island-shaped semiconductor film 55. Then, as shown in FIG. 6E, an interlayer insulating film 59 is formed, contact holes are formed, and a source electrode 64 and a drain electrode 65 which are connected with the source 62 and the drain 63 coupled through a channel 61 are formed.

In the above-described processes, the channel 61 is formed in accordance with a position of a crystal with a large particle size of the polycrystal semiconductor film or the single-crystallized semiconductor film 54 generated in the processes shown in FIGS. 6A and 6B. With the above-described processes, a TFT 60 can be formed into a polycrystal transistor or a single-crystallized semiconductor. The thus manufactured polycrystal transistor or single-crystallized transistor can be applied to a drive circuit for a liquid crystal display unit (a display) or an EL (electroluminescence) display or an integrated circuit for a memory (an SRAM or a DRAM) or a CPU.

Another type of a laser crystallization apparatus, according to the present invention, will be described with reference to FIG. 7.

This laser crystallization apparatus has a temperature-adjusting unit that adjusts the temperatures of the optical components of the telecentric lens image formation optical system 4A. (Of the optical components, only lenses L1 to L6 are shown in FIG. 7.) The temperature-adjusting unit has a heater 91 and a Peltier element 92, which contact the holder 83*d* (i.e., outer cylinder) that holds the lenses L1 to L6. The heater 91 and element 92 constitute a unit that adjusts the temperature of the holder 83*d*.

The heater 91 can heat the components L1 to L6. The Peltier element 92 can cool the components L1 to L6. They adjust the temperatures of the lenses L1 to L6 by virtue of heat conduction. The temperature-adjusting unit has an atmosphere-adjusting function. More precisely, the unit makes gas of a predetermined temperature flow through the gaps between the lenses L1 to L6, thereby adjusting the temperature of the atmosphere in which the lenses L1 to L6 lie. The unit has a gas-supplying unit 93 that supplies, for example, inert gas 93*a* (e.g., nitrogen or helium) into the laser-beam path of the image formation optical system 3. The gas supplied from the gas-supplying unit 93 flows through the gaps between the lenses L1 to L6 and is discharged from the image formation optical system 4A.

The temperature-adjusting unit further has a temperature sensor 94 and a control unit 95. The temperature sensor 94 measures the temperature of, for example, the lens L5. The control unit 95 controls the heater 91, Peltier element 92 and gas-supplying unit 93 in accordance with the output of the temperature sensor 94. The temperature sensor 94 may be a thermocouple that contacts, for example, the lens L5. The control unit 95 adjusts the temperature and flow rate of the inert gas 93*a* supplied from the gas-supplying unit 93.

In the laser crystallization apparatus, at least one of the heater 91, Peltier element 92 and gas-supplying unit 93 is controlled by an instruction given by the control unit 95, as described above. The temperature of the lenses L1 to L5 constituting the image formation optical system 4A is thereby adjusted. As result, the magnification and image plane position of the image formation optical system 4A can be corrected. Crystal grains of a desired size can therefore be formed at desired positions with excellent reproducibility.

As specified above, the temperature-adjusting unit that adjusts the temperature of the holder 83*d* comprises the heater 91 and Peltier element 92, both set in contact with the holder 83*d*. Nonetheless, the temperature-adjusting unit may be changed in configuration. For example, a circulation unit 96 may be added, circulating cooling water of hot water around the holder 83*d*. The circulation unit 96 supplies water cooled or heated to a predetermined temperature, to the circumference of the holder 83*d* and collect the water from the holder 83*d*.

In the present embodiment, the temperature sensor 94 measures the temperature of an optical component (e.g., lens L5), and the temperature thus measured is used to adjust the temperature of the optical components (i.e., lenses L1 to L6) that are provided in that image formation optical system 4A. This invention is not limited to this. For example, the temperature sensor may be provided in contact with the holder 83*d* to measure the temperature of the holder 83*d*, and the temperature measured of the holder 83*d* may be used to adjust the temperature of the optical components (i.e., lenses L1 to L6) provided in the image formation optical system 4A.

Figure 7:
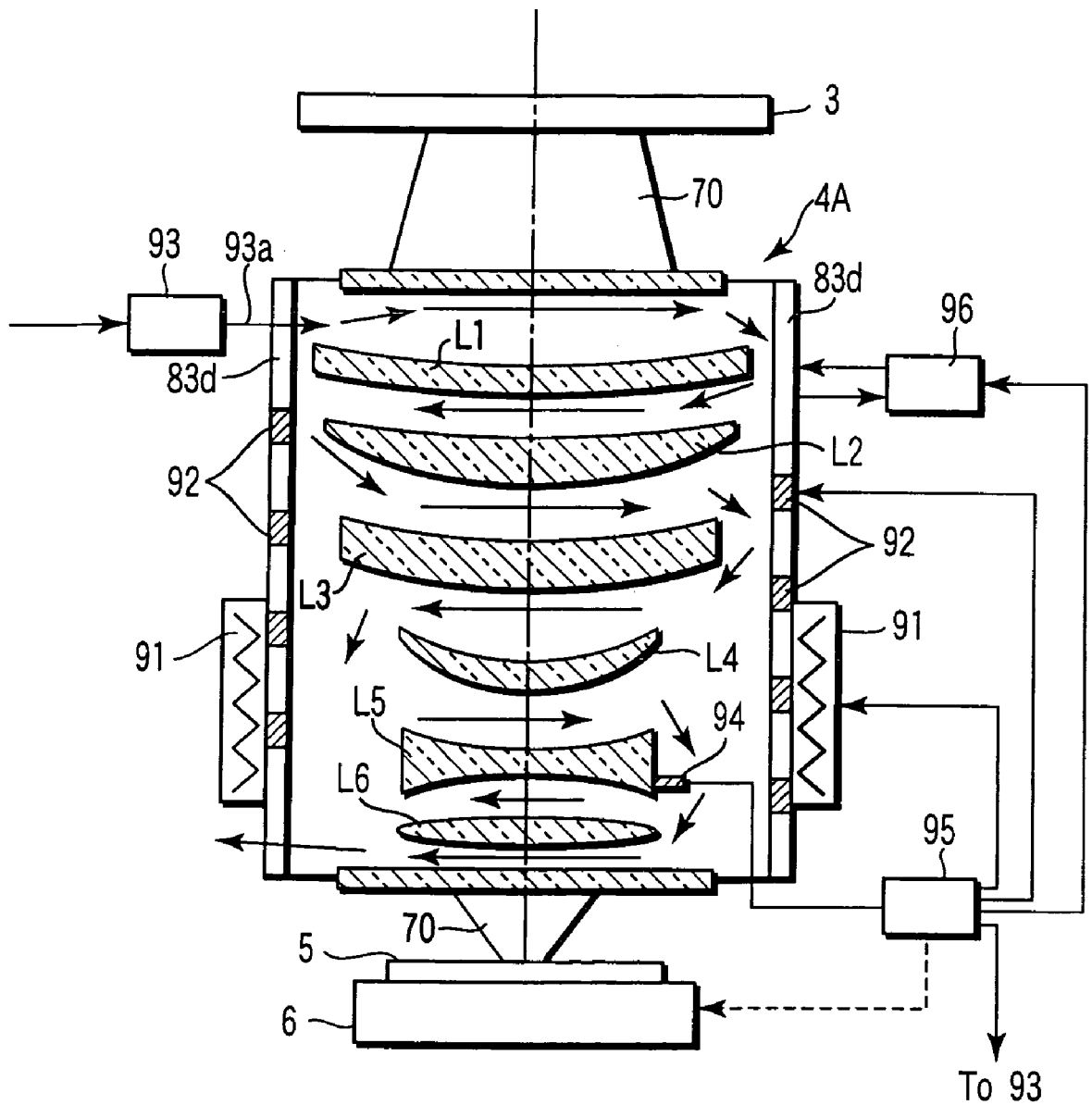
FIG. 7 is a sectional view of the telecentric lens system incorporated in a laser crystallization apparatus according to another embodiment of the invention.

As the arrow (indicated in broken line) shows in FIG. 7, the control unit 95 may drive the substrate stage 6 in accordance with the output of the temperature sensor 94 that measures the temperatures of the optical components (i.e., lenses L1 to L6) of the system 4A (or in accordance with the output of a temperature sensor (not shown) for measuring the temperature of the holder 83*d*). Thus, the substrate 5 being processed can be adjusted in position along the optical axis of the image formation optical system 4A.

A description will now be given as to an example where the laser crystallization apparatus according to this embodiment is utilized for production of a circuit of a liquid crystal display unit with reference to FIG. 9.

Figure 8:
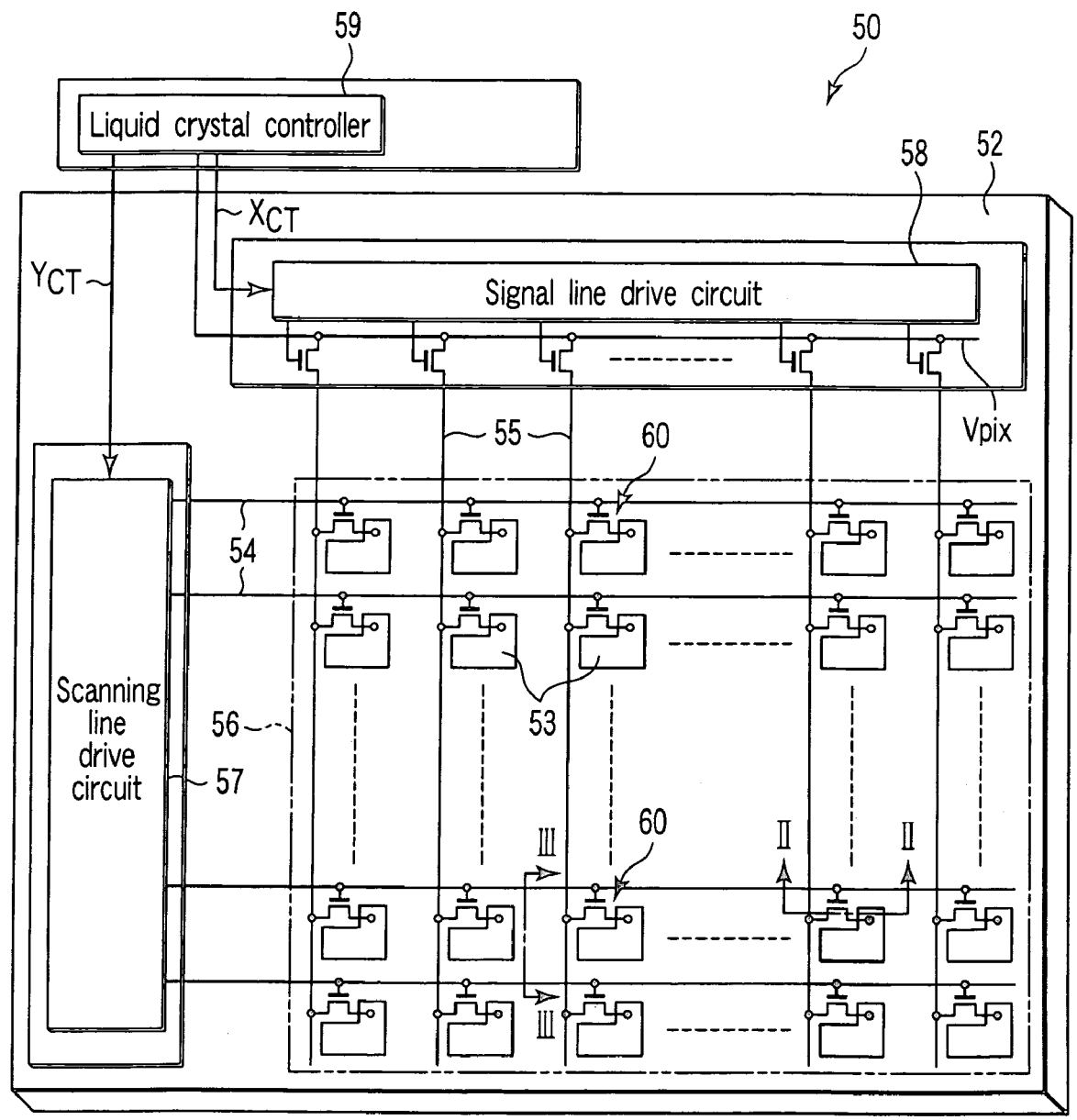
FIG. 8 is a block diagram showing an outline of a display apparatus.

A description will now be given as to an example where the laser crystallization apparatus according to this embodiment is utilized for production of a circuit of a liquid crystal display unit with reference to FIG. 8.

In an active matrix type liquid crystal display apparatus 50, many thin film transistors (TFTs) 60 are formed on an insulating substrate of, e.g., glass or plastic in order to individually drive respective pixels. Of silicon films used for a source, a drain and a channel area of the TFT, an amorphous silicon (a-Si) film has a low formation temperature and can be relatively easily formed by a gas phase method, and is superior in mass productivity. Therefore, the amorphous silicon film is generally utilized as a semiconductor thin film used for the TFT 60. However, the a-Si film has a drawback that it is inferior in physical properties such as an electric conductivity as compared with a polysilicon film (poly-Si) film (a mobility in the a-Si film is lower than that in the poly-Si film by double digits or more).

Thus, by using the laser crystallization apparatus 1 according to this embodiment to irradiate a desired part of the a-Si film with a laser light having a predetermined power (one shot corresponds to approximately 1 cm$^2$/J), crystalline silicon (poly-Si) is sequentially formed in areas which should be the source 62, the drain 63 and the channel 61 of the TFT 60. In this example, since the telecentric image formation optical system is thermally stabilized in the laser crystallization apparatus 1 according to this embodiment, the image formation optical system 4 is hardly displaced with respect to the processed substrate 5. Moreover, since the control portion 10 adjusts a position of the non-single-crystal semiconductor 5 along the optical axis of the image formation optical system 4 based on an output from the temperature sensor 22, desired parts from the first TFT to the last TFT can be accurately irradiated with the laser light 70.

The liquid crystal display apparatus 50 comprises a transparent base substance 52, pixel electrodes 53, scanning lines 54, signal lines 55, an opposing electrode 56, thin film transistors 60, a scanning line drive circuit 57, a signal line drive circuit 58, a liquid crystal controller 59 and others. That is, in the liquid crystal display apparatus 50, each TFT 60 shown in FIG. 6E is used in each peripheral circuit portion such as the scanning line drive circuit 57 or the signal line drive circuit 58 which requires a high-speed operation.

This liquid crystal display apparatus 50 can realize a system display including active elements such as a peripheral circuit portion or a memory circuit portion. The TFT 60 is formed to have such a structure as shown in FIG. 6E, and constitutes each peripheral circuit portion which requires a high-speed operation, e.g., the scanning line drive circuit 57 or the signal line drive circuit 58. In the peripheral circuit portion such as the scanning line drive circuit 57 or the signal line drive circuit 58, the TFT having a source end position of a source area S or a drain end position of a drain area D formed thereto can be constituted within 0.05 to 0.2 μm from a crystal growth end position. That is, the peripheral circuit can be constituted of the TFT having the excellent characteristics in which a mobility (μmax) is not less than 300 cm$^2$/V·s.

The thus manufactured display apparatus can realize a system display including active elements such as a peripheral circuit or a memory circuit. This display apparatus is also effective in reducing a size and reducing a weight.

Although the above embodiment has described the example of the active matrix type liquid crystal display apparatus, the present invention is not restricted thereto, and the present invention can be also applied to production of an organic EL display apparatus.

What is claimed is:

1. A laser crystallization apparatus for applying a laser light to a non-single-crystal semiconductor to locally fuse the non-single-crystal semiconductor, the laser light having a light intensity distribution with an inverse peak shape and perform growth on crystal grains that are crystallized while being solidified, the apparatus comprising:

a light source;

a spatial intensity modulation optical element which modulates an intensity and a phase of the laser light from the light source;

an illumination system which is provided between the light source and the spatial intensity modulation optical element, homogenizes a light intensity of the laser light from the light source and illuminates the spatial intensity modulation optical element with the homogenized light;

a stage which supports a substrate on which the non-single-crystal semiconductor film is deposited;

an image formation optical system having a plurality of optical members which is provided between the non-single-crystal semiconductor on the stage and the spatial intensity modulation optical element and forms an image of a laser light modulated by the spatial intensity modulation optical element at a desired part on the non-single-crystal semiconductor;

a temperature adjustment portion which adjusts a temperature of the optical members by heating or cooling the optical members of the image formation optical system;

a temperature sensor which detects a temperature of the optical members; and controlling means for relatively moving the stage and the image formation optical system along an optical axis of the image formation optical system based on a detected temperature from the temperature sensor, thereby adjusting a relative position of the image formation optical system and the non-single-crystal semiconductor, and causing the temperature adjustment portion to adjust a temperature of the optical members.

2. The apparatus according to claim 1, wherein the image formation optical system has a holding member which is in contact with rims alone of the plurality of optical members in order to support the optical members, the holding member has an internal flow path formed to surround the rims of the optical members, and the internal flow path communicates a supply source which supplies a refrigerant fluid.

3. The apparatus according to claim 2, wherein a circulating flow path which circulates the refrigerant fluid between the supply source and the internal flow path is provided.

4. The apparatus according to claim 2, wherein the temperature adjustment portion has a heater which heats the holding member.

5. The apparatus according to claim 2, wherein the temperature adjustment portion has:

a refrigerant gas supply source;

a gas inlet which communicates with each of the refrigerant gas supply source and the inside of the image formation optical system;

an upper space which communicates with the gas inlet and in which an optical member closest to the light source in the plurality of optical members is exposed;

a gas outlet which communicates with the inside of the image formation optical system;

a lower space which communicates with the gas outlet and in which an optical member closest to the stage in the plurality of optical members is exposed; and an internal flow path which is formed in the holding member and communicates with each of the spaces between the optical members, the upper space and the lower space.

6. The apparatus according to claim 5, wherein the refrigerant gas is a nitrogen gas or a helium gas.

7. The apparatus according to claim 5, further having controlling means for controlling a flow quantity of the refrigerant gas supplied to the spaces between the optical members.

8. The apparatus according to claim 1, wherein the optical members have a first telecentric lens group arranged on the light source side, a second telecentric lens group arranged on the non-single-crystal semiconductor side, and an aperture diaphragm arranged between the first telecentric lens group and the second telecentric lens group.

9. The apparatus according to claim 1, wherein the image formation optical system is one of a both-side telecentric lens optical system or an image side telecentric lens optical system.

10. A laser crystallization apparatus for applying a laser light to a non-single-crystal semiconductor to locally fuse the non-single-crystal semiconductor, the laser light having a light intensity distribution with an inverse peak shape and perform growth on crystal grains that are crystallized while being solidified, the apparatus comprising:
- a light source;
- a spatial intensity modulation optical element which modulates an intensity and a phase of the laser light from the light source;
- an illumination system which is provided between the light source and the spatial intensity modulation optical element, homogenizes a light intensity of the laser light from the light source and illuminates the spatial intensity modulation optical element with the homogenized light;
- a stage which supports the non-single-crystal semiconductor;
- an image formation optical system having a plurality of optical members and a holding member which holds the optical members, which image formation optical system is provided between the non-single-crystal semiconductor on the stage and the spatial intensity modulation optical element and forms an image of a laser light modulated by the spatial intensity modulation optical element at a desired part on the non-single-crystal semiconductor;
- a temperature adjustment portion which adjusts a temperature of the optical members by heating or cooling the optical members of the image formation optical system, or by heating or cooling the holding member;
- a temperature sensor which detects a temperature of at least one of the optical members and the holding member; and
- controlling means for relatively moving the stage and the image formation optical system along an optical axis of the image formation optical system based on a detected temperature from the temperature sensor, thereby adjusting a relative position of the image formation optical system and the non-single-crystal semiconductor, and causing the temperature adjustment portion to adjust a temperature of the optical members and the holding member.

11. The apparatus according to claim 10, wherein the holding member has an internal flow path formed to surround rims of the optical members, and
the internal flow path communicates with a supply source which supplies a refrigerant fluid.

12. The apparatus according to claim 11, wherein a circulating flow path which circulates the refrigerant fluid between the supply source and the internal flow path is provided.

13. The apparatus according to claim 11, wherein the temperature adjustment portion has a heater which heats the holding member.

14. The apparatus according to claim 11, wherein the temperature adjustment portion has:
- a refrigerant gas supply source;
- a gas inlet which communicates with each of the refrigerant gas supply source and the inside of the image formation optical system;
- an upper space which communicates with the gas inlet and in which an optical member closest to the light source in the plurality of optical members is exposed;
- a gas outlet which communicates with the inside of the image formation optical system;
- a lower space which communicates with the gas outlet and in which an optical member closest to the stage in the plurality of optical members is exposed; and
- an internal flow path which is formed in the holding member and communicates with each of the spaces between the optical members, the upper space and the lower space.

15. The apparatus according to claim 14, wherein the refrigerant gas is a nitrogen gas or a helium gas.

16. The apparatus according to claim 14, wherein the controlling means controls a flow quantity of the refrigerant gas supplied to the spaces between the optical members.

17. The apparatus according to claim 10, wherein the optical members have a first telecentric lens group arranged on the light source side, a second telecentric lens group arranged on the non-single-crystal semiconductor side, and an aperture diaphragm arranged between the first telecentric lens group and the second telecentric lens group.

18. The apparatus according to claim 10, wherein the image formation optical system is one of a both-side telecentric lens optical system or an image side telecentric lens optical system.

* * * * *